(12) United States Patent
Kokubo et al.

(10) Patent No.: US 11,213,997 B2
(45) Date of Patent: Jan. 4, 2022

(54) TRANSFER APPARATUS AND TRANSFER METHOD

(71) Applicant: Toshiba Kikai Kabushiki Kaisha, Tokyo (JP)

(72) Inventors: Mitsunori Kokubo, Numazu (JP); Yuki Sugiura, Mishima (JP); Shigeru Fujiwara, Numazu (JP); Yuki Hashimoto, Numazu (JP)

(73) Assignee: Shibaura Machine Co., Ltd., Tokyo (JP)

( * ) Notice: Subject to any disclaimer, the term of this patent is extended or adjusted under 35 U.S.C. 154(b) by 368 days.

(21) Appl. No.: 15/950,725

(22) Filed: Apr. 11, 2018

(65) Prior Publication Data

US 2018/0304521 A1 Oct. 25, 2018

(30) Foreign Application Priority Data

Apr. 24, 2017 (JP) .............................. JP2017-085106

(51) Int. Cl.
| | |
|---|---|
| *B29C 59/00* | (2006.01) |
| *B29C 59/04* | (2006.01) |
| *B29C 35/10* | (2006.01) |
| *B29C 35/08* | (2006.01) |
| *G03F 7/00* | (2006.01) |

(52) U.S. Cl.
CPC ............ *B29C 59/002* (2013.01); *B29C 35/10* (2013.01); *B29C 59/046* (2013.01); *G03F 7/0002* (2013.01); *B29C 35/0805* (2013.01); *B29C 2035/0827* (2013.01)

(58) Field of Classification Search
CPC ... G03F 7/0002; B29C 59/002; B29C 59/046; B29C 35/10; B29C 2035/0827; B29C 35/0805
See application file for complete search history.

(56) References Cited

U.S. PATENT DOCUMENTS

| | | | | |
|---|---|---|---|---|
| 2013/0071577 A1* | 3/2013 | Yasukochi | ............ | B29C 39/148 427/521 |
| 2014/0150679 A1* | 6/2014 | Claude | .................. | B41F 9/1018 101/167 |

FOREIGN PATENT DOCUMENTS

| | | |
|---|---|---|
| CN | 1593914 A | 3/2005 |
| JP | 2013-086477 | 5/2013 |
| JP | 2016-197672 | 11/2016 |
| JP | 2016197672 A * | 11/2016 |
| JP | 2017-069495 | 4/2017 |

(Continued)

OTHER PUBLICATIONS

Office Action dated Dec. 12, 2018 in Taiwan Application No. 10721175260.

(Continued)

*Primary Examiner* — Jacob T Minskey
*Assistant Examiner* — S. Behrooz Ghorishi
(74) *Attorney, Agent, or Firm* — DLA Piper LLP US

(57) ABSTRACT

A transfer apparatus of an embodiment includes a substrate installation part on which a substrate provided with an uncured material is installed, a mold presser roller for pressing the mold against the substrate by a movement of the mold presser roller to the substrate installed on the substrate installation part, and a material recovery unit capable of recovering the uncured material protruding from between the substrate and the mold by the movement of the mold pressure.

6 Claims, 11 Drawing Sheets

(56) References Cited

FOREIGN PATENT DOCUMENTS

KR       20120007695 A   *   1/2012
TW       201351061      12/2013

OTHER PUBLICATIONS

English Language Abstract of JP 2016-197672 published Nov. 24, 2016.

* cited by examiner

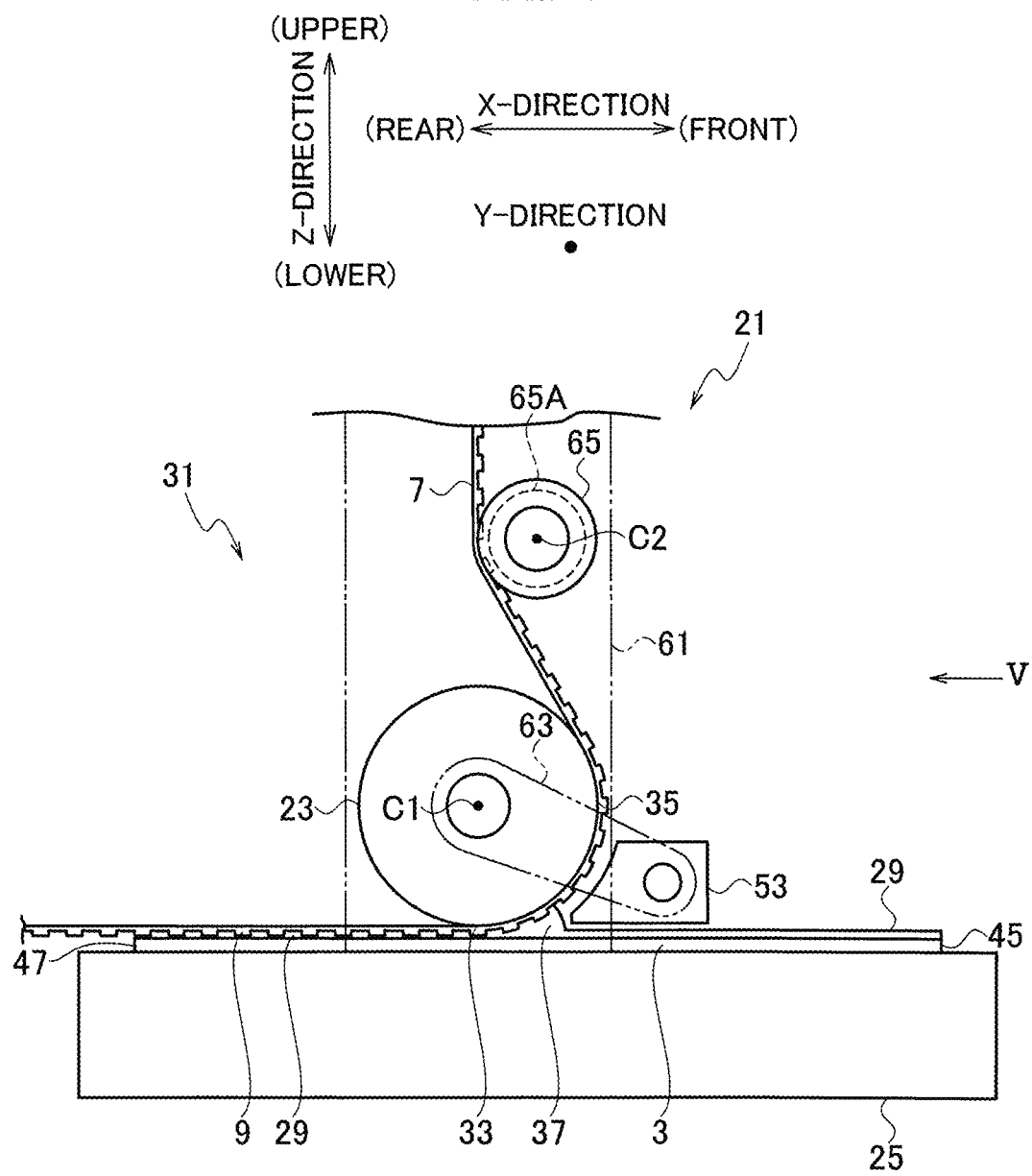

TRANSFER APPARATUS AND TRANSFER METHOD

CROSS REFERENCE TO RELATED APPLICATION

This application is based upon and claims the benefit of priority from Japanese Patent Applications No. 2017-085106, filed Apr. 24, 2017; the entire contents of which are incorporated herein by reference.

FIELD

Embodiments described herein relate generally to a transfer apparatus and a transfer method for transferring a transfer pattern of a mold to a material provided on an upper surface of a substrate.

BACKGROUND

In a conventional example, there is known a transfer apparatus that is configured to: move a roller around which a long-sheet like mold having a predetermined transfer pattern formed thereon is wound; press the mold against a substrate on which ultraviolet curable resin is provided; and irradiate ultraviolet light to cure the ultraviolet curable resin, thereby roll-transferring the fine transfer pattern of the mold to the ultraviolet curable resin.

If the fine transfer pattern has a height of about 10 micrometers, it has been performed to previously paint the ultraviolet curable resin on the substrate with a margin of height of about several micrometers. This is because if there is no margin in the height of the ultraviolet curing resin applied to the substrate, there is a possibility that the resulting pattern has a portion where the height of the transfer pattern is insufficient due to the shortage of the ultraviolet curing resin.

A conventional transfer apparatus will be described with reference to FIGS. 13 and 14. When roll-transferring with the use of the conventional transfer apparatus, surplus resin 303 is pushed out with the movement of a roller 301 to the right of FIGS. 13 and 14, so that the amount of the surplus resin 303 becomes nearly maximum at the end of the roll-transfer operation.

When performing wiring for a touchscreen of a large-sized liquid crystal television, the moving distance of the roller 301 becomes longer, so that the amount of the accumulated surplus resin 303 becomes larger at the end of the roll-transfer operation. In a screen for a recent liquid crystal television or a smartphone, the area of a frame for supporting the screen becomes smaller and therefore, it is required to form a transfer pattern up to edges of a substrate 305 such as a glass.

As a result, the accumulated surplus resin 303 is extruded and spilled out from the substrate 305. This spilled surplus resin may go around behind the substrate 305 or adhere to a substrate installation body 307.

Then, the surplus resin enters vacuum adsorption holes for the substrate placement body 307 (i.e. holes for vacuum-adsorbing the substrate 305 to fix the substrate 305 on the substrate installation 307). If this resin is UV curable resin (ultraviolet curable resin), it will be cured with irradiation of ultraviolet light, requiring a hard time to remove it.

BRIEF DESCRIPTION OF DRAWINGS

FIG. 4 is a view illustrating a schematic configuration of the transfer apparatus according to the embodiment in which the material recovery block is located at a recovery position.

DETAILED DESCRIPTION

A transfer apparatus 21 according to an embodiment will be described with reference to drawings.

A product (or semi-finished product) 1 manufactured by the transfer apparatus 21 according to the embodiment will be described with reference to FIG. 12.

The product 1 is used for an application, for example, touchscreen wiring of a liquid crystal panel for a television or a smartphone. The product 1 includes a substrate 3 and a protrusion 5 having a predetermined shape (predetermined pattern).

For convenience of explanation, it is assumed that one predetermined horizontal direction is an X-direction (front and rear direction), another horizontal direction orthogonal to the X-direction is a Y-direction (width direction), and one direction orthogonal to the X-direction and the X-direction is a Z-direction (vertical direction).

Figure 12A:
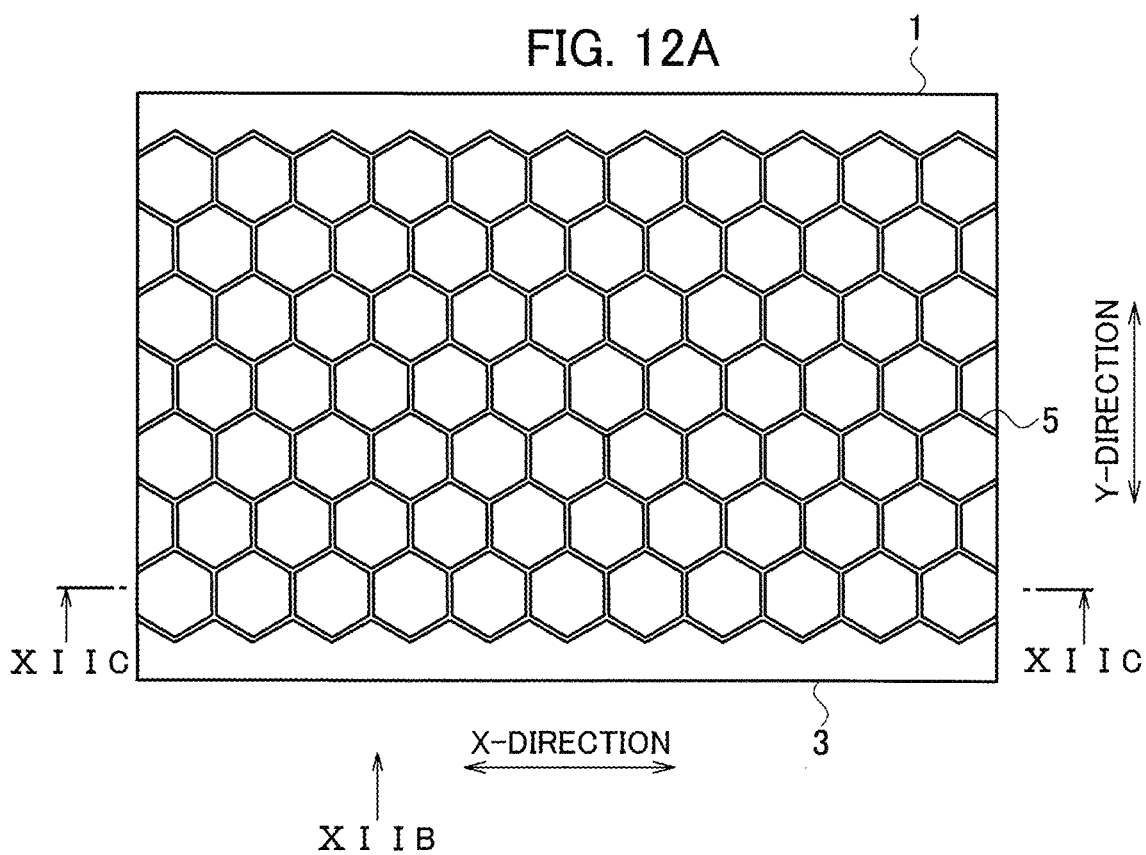
FIG. 12A is a view illustrating a product (semi-finished product) manufactured by the transfer apparatus according to the embodiments.
Figure 12B:
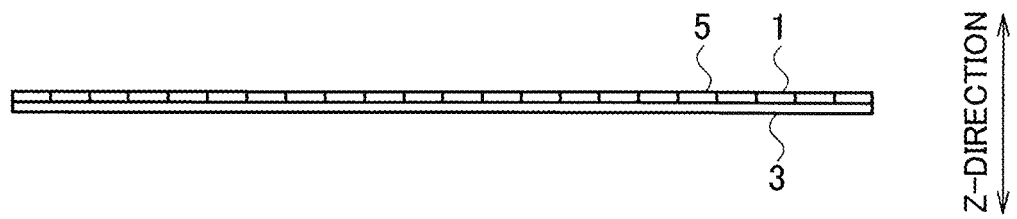
FIG. 12B is a view viewed in the direction of an arrow XIIB of FIG. 12A.
Figure 12C:
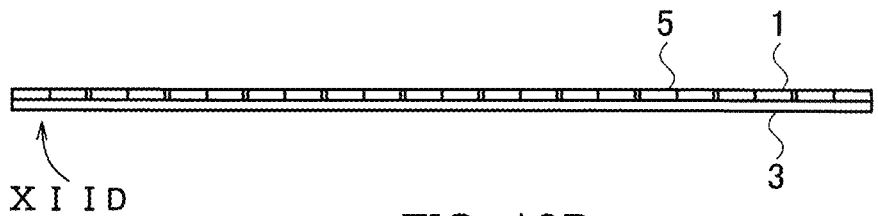
FIG. 12C is a view illustrating a cross sectional view taken along a line XIIC-XIIC of FIG. 12A.
Figure 12D:
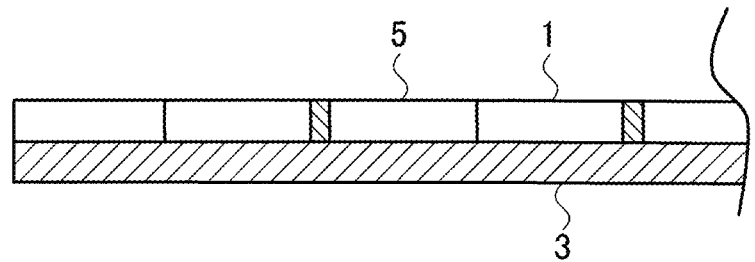
FIG. 12D is an enlarged view of an XIID part of FIG. 12C.
Figure 13:
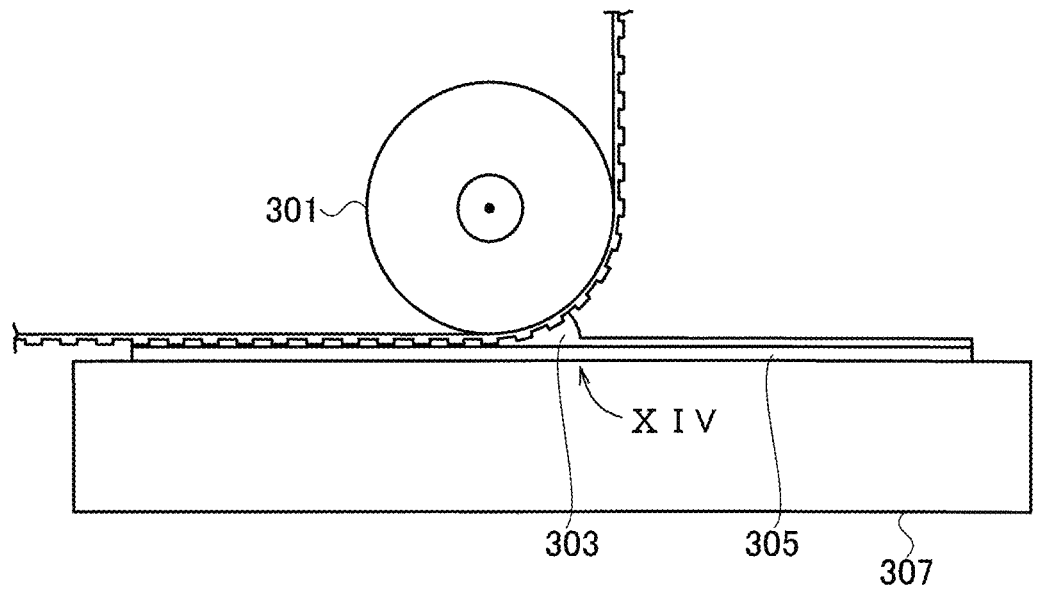
FIG. 13 is a view illustrating a schematic configuration of a conventional transfer apparatus.
Figure 14:
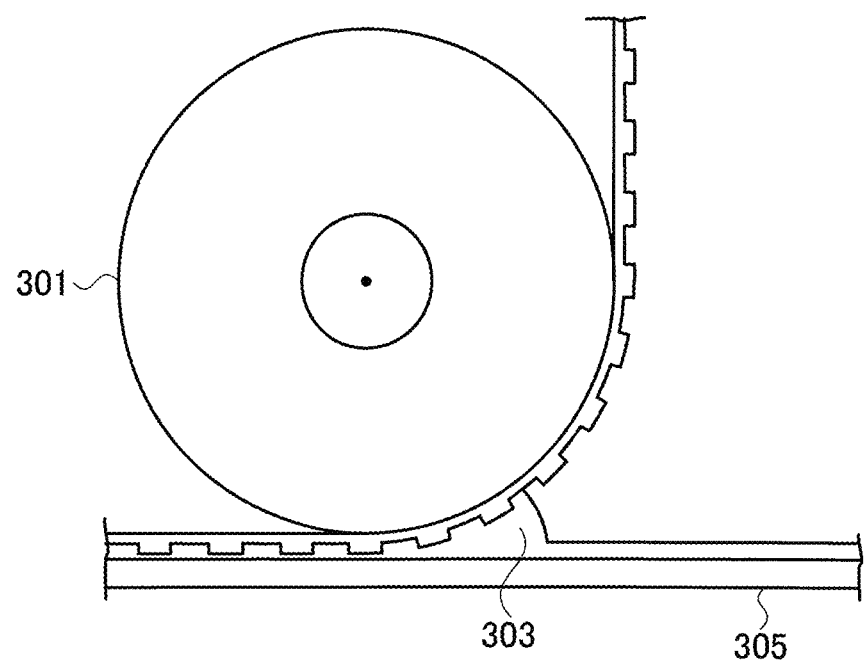
FIG. 14 is an enlarged view illustrating a part XIV of FIG. 13.

The substrate 3 is, for example, composed of glass or synthetic resin. The protrusion 5 is, for example, composed of a material cured by irradiation with predetermined electromagnetic waves. The protrusion 5 is formed into a predetermined shape, which is obtained by transferring a transfer pattern 9 formed on a mold 7 (see FIGS. 1 and 2), and provided on one surface (an upper surface) of the substrate 3 in the thickness direction (Z-direction). As illustrated in FIG. 12A, the protrusion 5 includes, for example, a plurality of regular hexagonal sides adjacent to each other.

Next, the transfer apparatus 21 according to the embodiment will be described.

Figure 1:
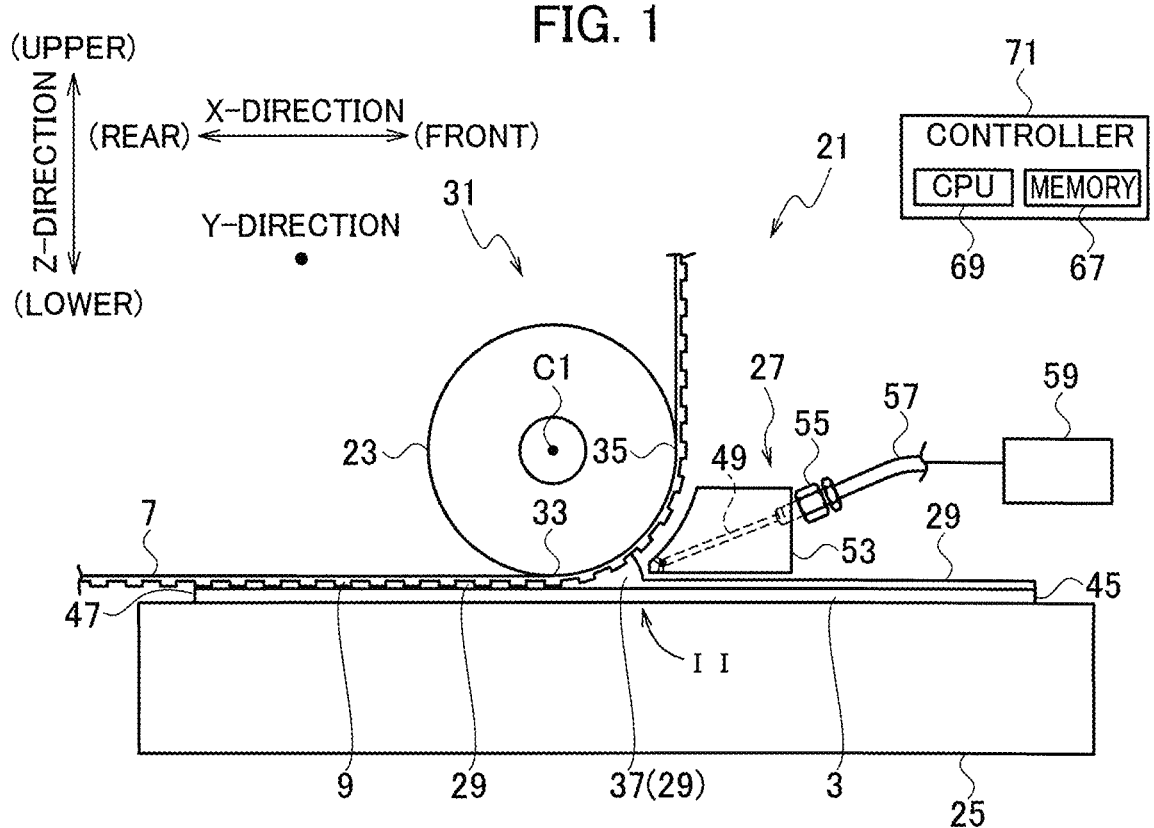
FIG. 1 is a view illustrating a schematic configuration of a transfer apparatus according to an embodiment.

In FIG. 1 and the like, one side in the X-direction is assumed as a rear side, while the other side in the X-direction is assumed as a front side. As will be described in detail later, when the mold 7 is pressed against the substrate 3, a mold presser roller 23 moves from the rear side to the front side in the X-direction. On the other hand, when the mold 7 being pressed against the substrate 3 is peeled from the substrate 3, the mold presser roller 23 moves from the front side to the rear side in the X-direction.

As illustrated in FIG. 1 and the like, the transfer apparatus 21 includes a substrate installation part 25, the mold presser roller 23, and a material recovery unit (uncured-resin recovery unit) 27.

The substrate 3 is installed on the substrate installation part 25. The substrate 3 is provided, on its upper surface, with an uncured material 29 in the form of a film. This substrate 29 may be referred to as "uncured material-preinstalled substrate 3" hereinafter.

The substrate 3 is formed like, for example, a rectangular flat plate. The thickness direction of the uncured material-preinstalled substrate 3 installed on the substrate installation part 25 coincides with the Z-direction. The uncured material 29 provided on the upper surface of the substrate 3 can be cured by irradiation with electromagnetic waves of a predetermined wavelength. For example, an uncured ultraviolet curable resin is listed as the uncured material 29. Also, ultraviolet light is listed as the electromagnetic waves of the predetermined wavelength.

The upper surface of the substrate installation part 25 is planar. When the lower surface of the substrate 3 is brought into contact with the upper surface of the substrate installation part 25 and subsequently vacuum-sucked for example, the uncured material-preinstalled substrate 3 is integrally installed on the substrate installation part 25.

The transfer apparatus 21 is provided with a mold installation unit 31 on which the mold 7 is installed. For example, the mold 7 is formed into an elongated sheet (belt-like shape) having a predetermined width and a predetermined length. By being wound up into a roll, the mold 7 constitutes a mold rolled web (not illustrated). In arrangement, a longitudinal portion of the mold 7 on the side of a leading end is delivered forward from the mold rolled web. In the delivered longitudinal portion of the mold 7, a further leading portion is wound up to form a winding roll (not illustrated).

In a state where the mold 7 is installed on the mold installation unit 31, the mold rolled web is installed at one predetermined part of the mold installation unit 31, while the winding roll is installed at another predetermined part of the mold installation unit 31. As illustrated in FIG. 1, an intermediate portion of the mold 7 in the longitudinal direction extends into a flat plate without producing any slack between the mold rolled web and the winding roll.

The mold 7 extending into a flat plate without producing any slack between the mold rolled web and the winding roll has a width direction identical to the Y-direction and is located on the upper side of the substrate 7 installed on the substrate installation part 25.

The mold presser roller 23 is wound with the mold 7 which is formed, on one surface in the thickness direction, with a predetermined transfer pattern 9.

With the mold presser roller 23 moving toward the uncured material-preinstalled substrate 3 installed on the substrate installation part 25 and the mold 7 installed on the mold installation unit 31, the mold 7 installed on the mold installation unit 31 is pressed against the substrate 3 installed on the substrate installation part 25.

The mold presser roller 23 is formed in a columnar or cylindrical shape having a center axis C1 extending in the Y-direction and rotates about the center axis C1. The mold 7 extending without producing any slack between the mold rolled web and the winding roll is wound around a portion of an outer circumferential surface of the mold presser roller 23.

When the state where the mold 7 is wound around the mold presser roller 23 is viewed in the Y-direction, as illustrated in FIG. 1, it is evident that the mold presser roller 23 is positioned on the upper side of the uncured material-preinstalled substrate 3 installed on the substrate installation part section 25. Additionally, the other surface of the mold 7 in the thickness direction (on which the predetermined transfer pattern 9 is not formed) is positioned on the upper side of the mold 7 to abut on the mold presser roll 23, while one surface of the mold 7 in the thickness direction (the surface formed with the predetermined transfer pattern 9) is positioned on the lower side of the mold 7.

Also, when the state where the mold 7 is wrapped around the mold presser roll 23 is viewed in the Y-direction, the portion of the mold 7 wrapped around the mold presser roll 23 is formed in arc shape (e.g. a quarter arc) between a lowermost end 33 (the lower end in the Z-direction) of the mold presser roll 23 and its foremost end 35 (the front end in the X-direction) of the mold presser roll 23.

Again, when the state where the mold 7 is wrapped around the mold presser roll 23 is viewed in the Y-direction, the mold 7 becomes linear in the rear side of the lowermost end 33 of the mold presser roll 23 in the X-direction and also extends in the X-direction, and the mold rolled web (not illustrated) is arranged ahead of this extending portion of the mold 7. Meanwhile, the mold 7 extends linearly on the upper side of the foremost end 35 of the mold presser roller 23 in the Z-direction, and the winding roll (not illustrated) is arranged ahead of such an extending portion of the mold 7.

When pressing the mold 7 against the substrate 3 installed on the substrate installation part 25, the mold presser roller 23 moves in a predetermined direction (a direction from the rear side toward the front side in the X-direction) orthogonal to the thickness direction of the uncured material-preinstalled substrate 3.

When the mold 7 being pressed against the substrate 3 installed on the substrate installation part 25 is peeled from the substrate 3, the mold presser roller 23 moves in a direction from the front side to the rear side in the X-direction.

During these movements, the mold presser roller 23 rotates around the center axis C1 as a center of rotation in order to avoid an occurrence of slippage between the roller 23 and the wound mold 7 being wound around the roller 23.

Before starting for the mold presser roller 23 to press the mold 7 against the uncured material-preinstalled substrate 3 and after completing to peel the mold 7 from the substrate 3, the mold presser roller 23 is positioned, in the X-direction, on the rear side of the substrate 3 installed on the substrate installation part 25. In this state, the substrate 3 installed on the substrate installation part 25 and the mold 7 wound around the mold presser roller 23 are apart from each other.

On the other hand, when completing for the mold presser roller 23 to press the mold 7 against the substrate 3 and before starting to peel the mold 7 from the substrate 3, the mold presser roller 23 is positioned, in the X-direction, on the front side of the substrate 3 installed on the substrate installation part 25. When viewing this state in the Y-direction, the lower surface of the mold 7 formed with the transferred pattern 9 is opposed to the entire upper surface of the substrate 3 installed on the substrate installation part 25 through the film-like material 29 installed on the substrate 3.

When the mold presser roller 23 presses the mold 7 against the substrate 3 (when the roller 23 moves from the rear side to the front side in the X-direction), there are arranged, at the lower end 33 of the mold presser roller 23, the substrate 3 installed on the substrate installation part 25, the material 29 installed on the upper surface of the substrate 3, and the mold 7, in this order from the bottom to the top. Then, the substrate 3, the material 29 and the mold 7 are pinched between the substrate installation part 25 and the mold presser roller 23 at a predetermined pressure, and the predetermined transfer pattern 9 of the mold 7 enters the material 29 on the substrate 3.

When the mold presser roller 23 presses the mold 7 against the substrate 3, the thickness direction of the mold 7 and the thickness direction of the substrate 3 coincide with the Z-direction on the rear side of the lower end 33 of the mold presser roller 23. Then, there are arranged the substrate 3 installed on the substrate installation part 25, the material 29 installed on the substrate 3, and the mold 7, in this order from the lower side to the upper side in the Z-direction.

When the mold presser roller 23 presses the mold 7 against the substrate 3, the movement of the mold presser roller 23 from the rear side to the front side causes the lower end 33 of the mold presser roller 23 to move to the front side in the X-direction and also causes a flat plate-like portion of the mold 7, which extends from the lower end 33 of the mold presser roller 23 rearward, (i.e. an area of the lower surface of the mold 7 opposed to the substrate 3 installed on the substrate installation part 25, through the material 29) to increase gradually.

When the operation of the mold presser roller 23 to press the mold 7 against the substrate 3 is completed, for example, the entire upper surface of the substrate 3 installed on the substrate installation part 25 is opposed to the flat plate-like lower surface of the mold 7 through the material 29 in view of the Y-direction.

When the mold presser roller 23 presses the mold 7 against the substrate 3, the length of the mold 7 extending between the rolled mold web and the winding roll changes with the movement of the mold presser roller 23 around which the mold 7 is wound (for example, the length of the mold 7 becomes insufficient). In order to compensate for this deficiency, the transfer apparatus 21 is adapted so that the mold 7 is fed out from at least one of the mold rolled web and the winding roll. If the length of the mold 7 is excessive, the transfer apparatus 21 is adapted so that an excess part of the mold 7 is wound up by at least one of the mold rolled web and the winding roll.

When peeling the mold 7 from the substrate 3, the mold presser roller 23 is moved from the front side to the rear side. Also in this case, as the length of the mold 7 extending between the mold rolled web and the winding roll changes, the transfer apparatus 21 is configured to supply or wind up the mold 7 by at least one of the mold rolled web and the winding roll, as similar to the above-mentioned case.

The material recovery unit 27 is configured to recover uncured surplus material 37 protruding from between the substrate 3 and the mold 7 when the mold 7 is pressed against the substrate 3 by the movement of the mold presser roller 23.

Figure 2:
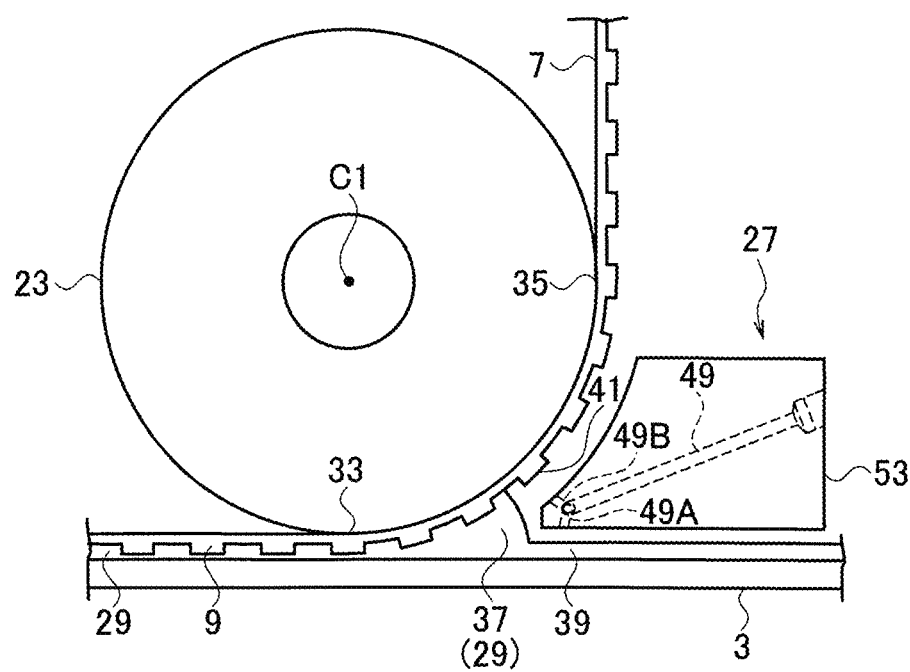
FIG. 2 is an enlarged view of a part II of FIG. 1.

When the mold 7 is pressed against the substrate 3 by the movement of the mold presser roller 23, the uncured material 29 existing between the substrate 3 and the mold 7 comes out from between the substrate 3 and the mold 7 to form the surplus material 37. As illustrated in FIG. 2, the surplus material 37 exists between the substrate 3 and the mold 7, slightly on the front side of the lower end 33 of the mold presser roller 23 in the moving direction of the mold presser roller 23.

More specifically, the uncured surplus material (surplus resin) 37 squeezed out from between the substrate 3 and the mold 7 is positioned slightly on the front side of the lower end 33 of the mold presser roller 23 and also formed in a fan shape when viewed in the Y-direction. The center of a fan-shaped arc of the uncured surplus material 37 is positioned on a straight line extending in the Y-direction through the lower end 33 of the mold presser roller 23 and also positioned in the material 29 existing between the substrate 3 and the mold 7.

The material recovery unit 27 is adapted so as to recover at least a portion of the fan-shaped uncured surplus material 37, over the entire length in the Y-direction.

Instead of or in addition to recovering the fan-shaped uncured surplus material 37, the material recovery unit 27 may recover a portion of the uncured material 29 on the substrate 3 in the vicinity of the fan-shaped uncured excess material 37 (i.e. uncured material indicated by reference numeral "39" of FIG. 2). Alternatively, the material recovery unit 27 may recover the uncured material 29 (i.e. uncured material indicated by reference numeral "41" of FIG. 2) that is slightly stuck on the mold 7, in the vicinity of the fan-shaped uncured excess material 37.

The transfer apparatus 21 is provided with an irradiation unit (not illustrated). When the mold presser roller 2 moves from the position illustrated in FIG. 1 to the right and the pressing of the mold 7 against the material-preinstalled substrate 3 has been completed, the irradiation unit 21 irradiates the electromagnetic waves of a predetermined wavelength (e.g. ultraviolet light) to the material (e.g. ultraviolet curable resin) 29 of the substrate 3 installed on the substrate installation part 25, through the mold 7 being pressed against the entire upper surface of the substrate 3.

The irradiation unit includes an ultraviolet-light emitting part of extending in the Y-direction. With the irradiation unit moving from the front side in the X-direction to the rear side while emitting ultraviolet light, all of the ultraviolet curable resin 29 existing between the substrate 3 and the mold 7 is cured.

The irradiation unit may be arranged on the rear side of the mold presser roller 23 and also positioned slightly away from the mold presser roller 23, and the irradiation unit may be adapted to move simultaneously with the movement of the mold presser roller 23. In such a case, before completing to press the mold 7 against the entire upper surface of the substrate 3 installed on the substrate installation part 25, the irradiation unit successively irradiates ultraviolet light to a portion of the substrate 3 where the pressing of the mold 7 has been completed, so that the ultraviolet curable resin 29 is cured.

Consequently, it is possible to prevent the ultraviolet curable resin 29 from flowing backward (i.e. a flow from the front side to the rear side).

After curing the material 29 by the irradiation unit, the mold presser roller 23 is moved to the left side of FIG. 1 to peel the mold 7 from the substrate 3 (the cured material 29). In this way, the product 1 illustrated in FIG. 12 can be obtained.

The transfer apparatus 21 may be provided with a material installation unit (not illustrated). For example, the material installation unit is configured to install the uncured material 29, which will be cured by irradiating electromagnetic waves of a predetermined wavelength, on the upper surface of the flat plate-like substrate 3 whose thickness direction coincides with the Z-direction, in a film state.

Here, the timing when the surplus material 37 is recovered by the material recovery unit 27 will be described.

The recovery of the surplus material 37 by the material recovery unit 27 is performed within a period from a time immediately before completing to pressing the mold 7 against the substrate 3 on the substrate installation part 25 until a time immediately after the completion of the pressing. That is, the recovery is performed within a period from a time immediately before the lower end 33 of the mold presser roller 23 arrives at the front end 45 of the substrate 3 until a time immediately after the arrival.

Besides, instead of or in addition to collecting the surplus material 37 at the above timing, the uncured surplus material 37 may be recovered during the pressing of the mold 7 against the substrate 3 installed on the substrate installation part 25, that is, at an appropriate time when the lower end 33 of the presser roller 23 is positioned between the rear end 47 and the front end 45 of the substrate 3 in the X-direction and additionally, the amount of the surplus material 37 exceeds a predetermined value.

Figure 10A:
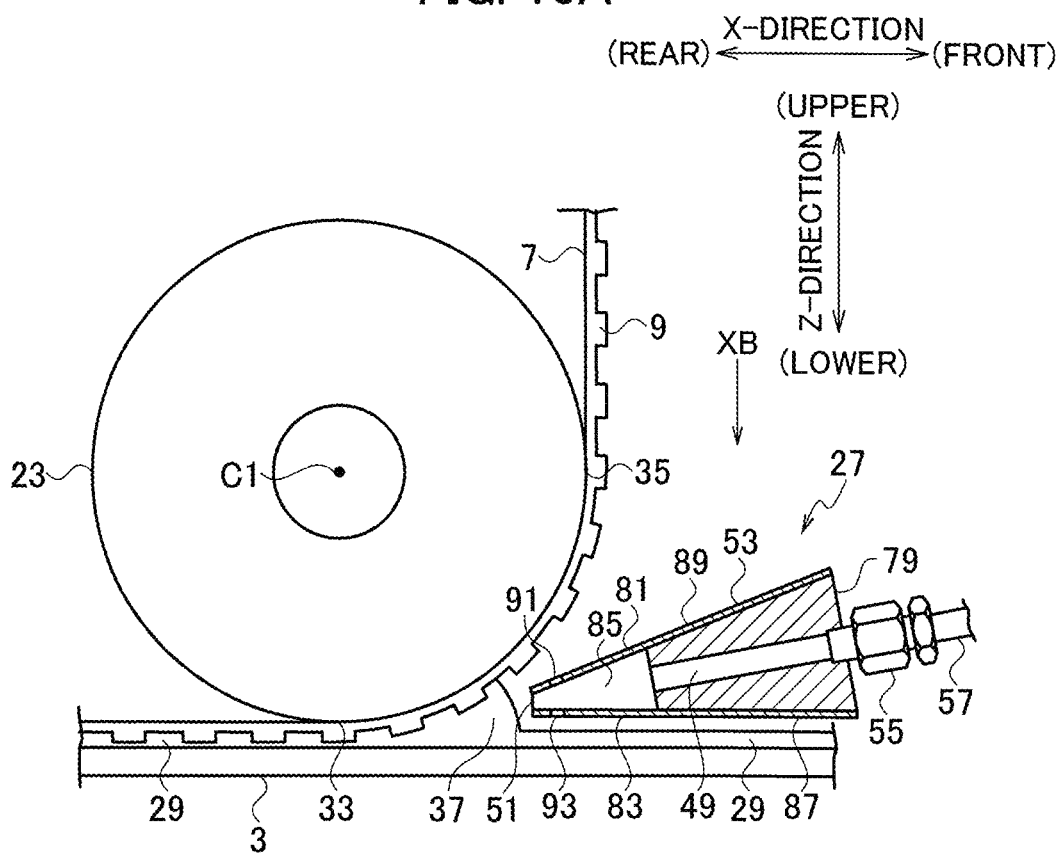
FIG. 10A is a view illustrating a material recovery block and the like of a transfer apparatus according to a third modification.
Figure 10B:
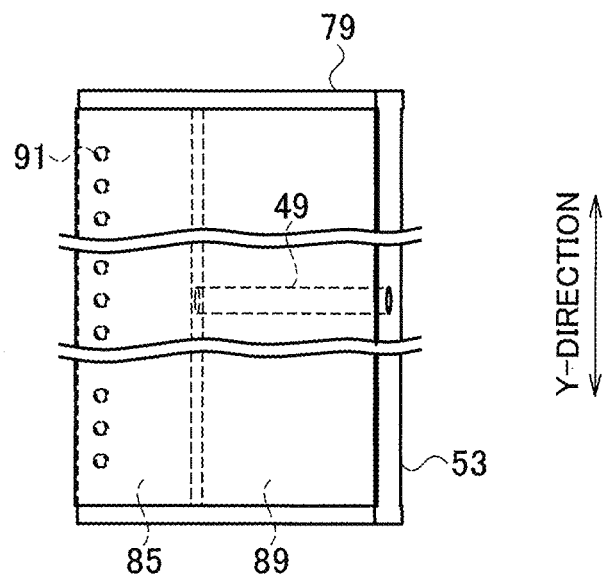
FIG. 10B is a view viewed in the direction of an arrow XB of FIG. 10A.
Figure 11A:
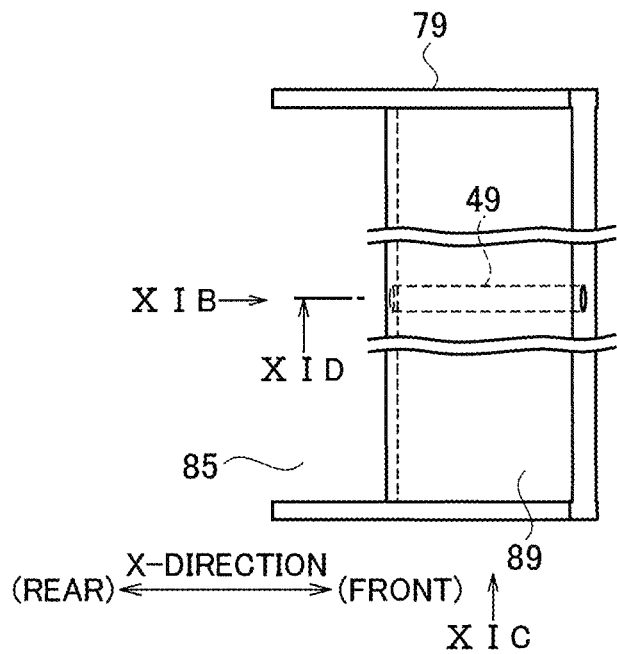
FIG. 11A is a view illustrating a main body part of the material recovery block of the transfer apparatus according to the third modification.
Figure 11B:
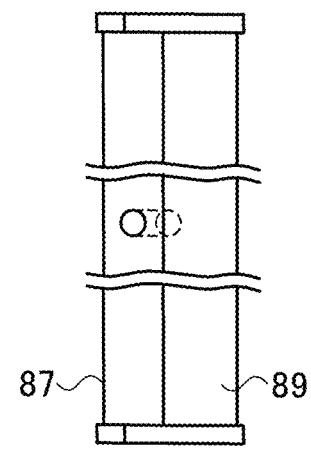
FIG. 11B is a view viewed in the direction of an arrow XIB of FIG. 11A.
Figure 11C:
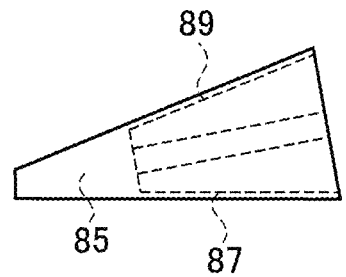
FIG. 11C is a view viewed in an arrow line XIC of FIG. 11A.
Figure 11D:
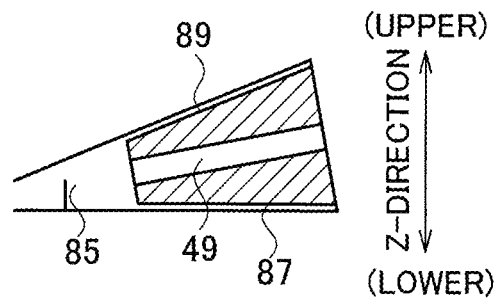
FIG. 11D is a cross sectional view taken along a line XID-XID of FIG. 11A.

The material recovery unit 27 includes a material recovery block 53 provided with holes 49 (see FIGS. 3A and 3B) or a slit 51 (see FIG. 10A) for sucking uncured material.

When the mold presser roller 23 moves to pressing the mold 7 against the material-preinstalled substrate 3 installed on the substrate installation part 25, the material recovery block 53 moves in response to the movement of the mold presser roller 23.

The material recovery block 53 is adapted so as to be rotatable with the mold presser roller 23. Then, the material recovery block 53 can be positioned to either a recovery position (see FIGS. 1 and 4) or a retreat position (see FIG. 6). The recovery position is a position for recovering the surplus material 37 that protrudes from between the substrate 3 and the mold 7 when the mold presser roller 23 moves to press the mold 7 against the substrate 3. On the other hand, the retreat position is a position, apart from the recovery position upward, where the block 53 does not recover the surplus material 37.

Figure 3A:
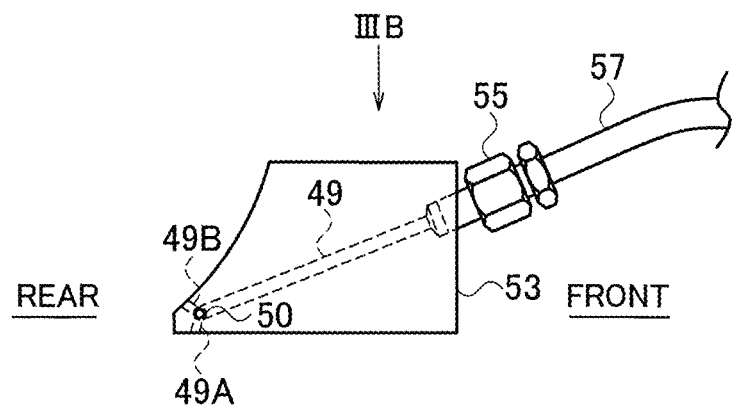
FIG. 3A is a view illustrating a material recovery block of a material recovery part of the transfer apparatus according to the embodiment.
Figure 3B:
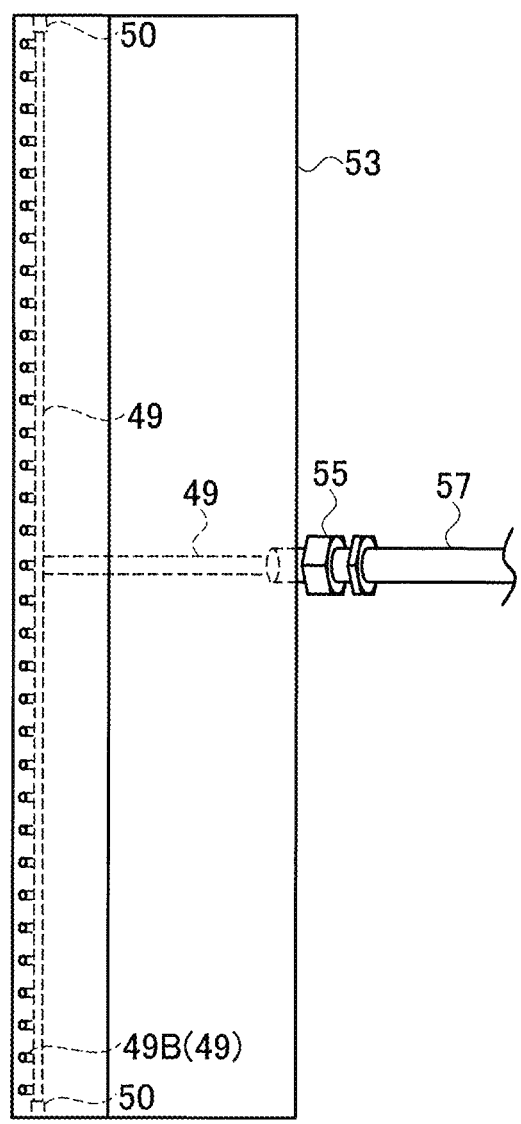
FIG. 3B is a view as viewed in the direction of an arrow IIIB of FIG. 3A.

As illustrated in FIGS. 2, 3A, and 3B, the material recovery block 53 is provided with a plurality of holes 49, for example, by drilling. One end of each of the holes 49 are located at the uncured surplus material 37 squeezed out from between the substrate 3 and the mold 7. In connection, a component indicated with reference numeral "50" is a stopper plug.

As illustrated in FIGS. 1, 3A, and 3B, the other end of each of the holes 49 is connected to a connector 55. A hose 57 extending from the connector 55 is connected to a suction device 59. Thus, with the operation of the suction device 59, the surplus material 37 is sucked and recovered through one end of each of the plurality of holes 49. One ends of the holes 49 as openings for sucking the surplus material 37 are juxtaposed at predetermined intervals in the longitudinal direction (Y-direction) of the material recovery block 53.

When the material recovery unit 27 recovers the uncured surplus material 37, the material recovery block 53 is arranged, in view of the Y-direction, in the vicinity of the mold presser roller 23 and the mold 7 wrapped around the mold presser roller 23 and also on the front side of the mold presser roller 23 and the mold 7 in the X-direction. When the material recovery unit 27 recovers the uncured surplus material 37, the material recovery block 53 is positioned, in view of the Y-direction, on the upper side of the material 29 of the substrate 3 in the Z-direction.

Here, the transfer apparatus 21 will be described in more detail.

Figure 5:
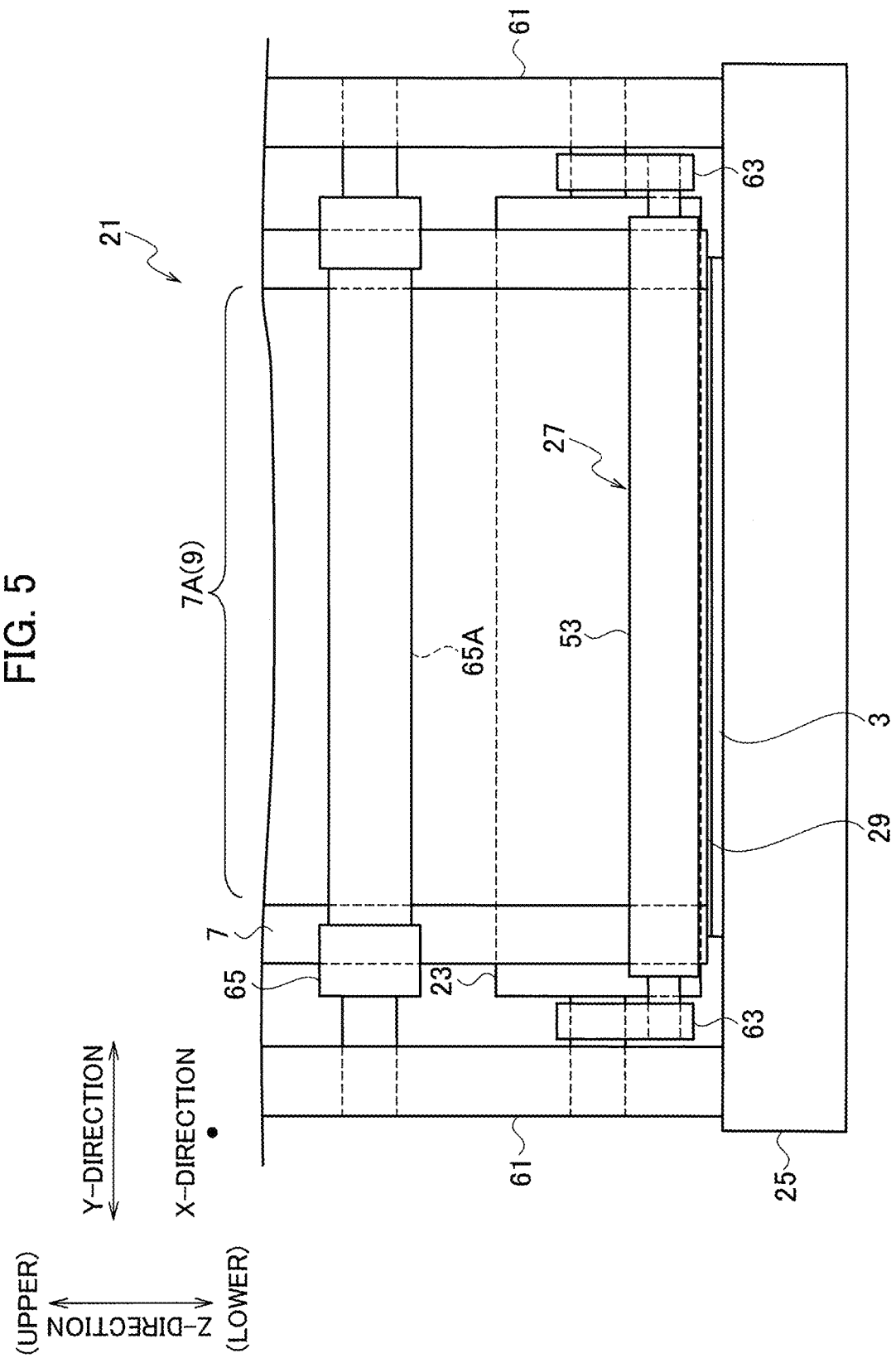
FIG. 5 is a view as viewed in the direction of an arrow V of FIG. 4.

As illustrated in FIG. 5, the mold presser roller 23 is supported by a pair of mold presser roller supports 61.

One of the mold presser roller supports 61 is disposed at one end of the substrate installation part 25 in the Y-direction, while the other one of the mold presser roller supports 61 is disposed on the other end of the substrate installation part 25 in the Y-direction. By an actuator, such as a linear motor, the respective mold presser roller supports 61 are movable synchronously with each other and also positionable to the substrate installation part 25 in the X-direction.

That is, the respective mold presser roller supports 61 are arranged in the same position in the X-direction. The substrate 3 is installed on the substrate installation part 25, between the pair of mold presser roller supports 61 in the Y-direction.

One end of the mold presser roller 23 in the extending direction of the center axis C 1 is rotatably engaged with one of the mold presser roller supports 61, while the other end of the roller 23 is rotatably engaged with the other one of the mold presser roller supports 61.

In order to prevent an occurrence of slippage between the mold 7 and the mold presser roller 23 when it is moving in the X-direction for purpose of pressing the mold 7 against the substrate 3 or the like, the mold presser roller 23 is adapted so as to rotate in synchronization with the movements of the mold presser roller supports 61 in the X-direction.

The mold presser roller 23 can be rotated by an actuator, such as a servomotor. Alternatively, the mold presser roller 23 may be designed to passively rotate with a rotating force generated by the movements of the mold presser roller supports 61.

Further, the mold presser roller 23 may be configured to be slightly movable and also positionable to the mold presser roller supports 61 in the Z-direction. Thus, the transfer apparatus 21 may be configured so that a catch force of the substrate installation part 25 and the mold presser roller 23 for catching the substrate 3, the resin 29, and the mold 7 can be adjusted in a case that the thickness of the substrate 3 or the thickness the mold 7 is changed.

As illustrated in FIG. 5, the dimension of the material recovery block 53 in the Y-direction is slightly larger than the width dimensions of the substrate 3 and the mold 7. Both ends of the material recovery block 53 in the longitudinal direction (Y-direction) are supported by material recovery block support arms 63.

One longitudinal end of one of the material recovery block support arms 63 is fixed to one longitudinal end of the material recovery block 53, while the other longitudinal end of one of the material recovery block support arms 63 is rotatably engaged with the mold presser roller 23 (which may be replaced by the mold presser roller support 61).

Similarly, one longitudinal end of the other of the material recovery block support arms 63 is also fixed to one longitudinal end of the material recovery block 53, while the other longitudinal end of the other of the material recovery block support arm 63 is rotatably engaged with the mold presser roller 23 (which may be replace by the mold presser roller support 61).

As a result, the material recovery block 53 and the pair of material recovery block support arms 63 are rotatable (swingable) with respect to the mold presser roller 23 about the center axis C1 of the mold presser roller 23 and also movable together with the mold presser roller 23 in the X-direction and the Z-direction.

Figure 6:
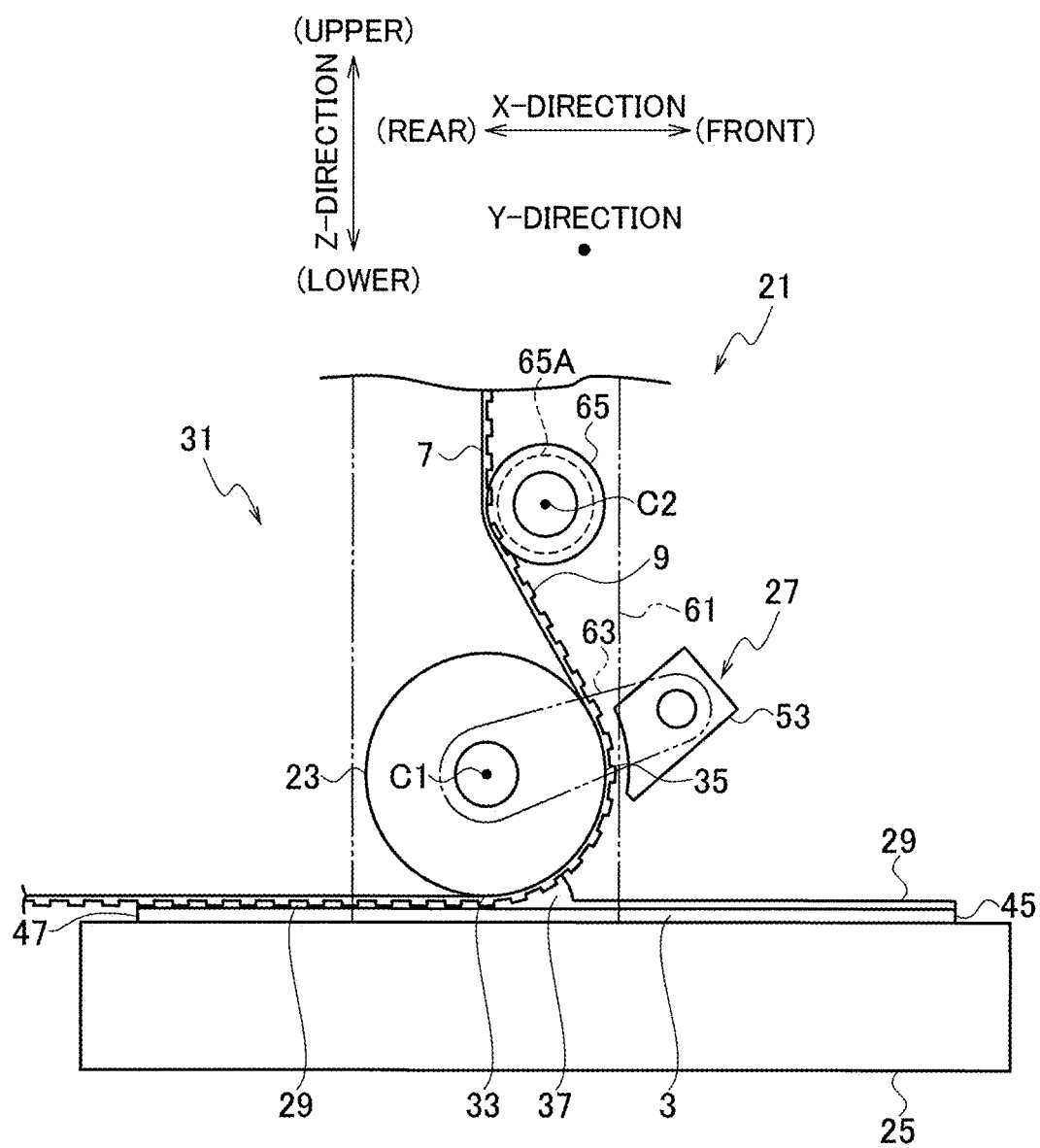
FIG. 6 is a view illustrating a schematic configuration of the transfer apparatus according to the embodiment in which the material recovery block is located at a retreat position.

The material recovery block 53 and the pair of material recovery block support arms 63 can be located at the recovery position illustrated in FIGS. 1 and 4 or the retreat position illustrated in FIG. 6 by an actuator (not illustrated) such as a pneumatic cylinder.

As illustrated in FIGS. 4 and 6, it is preferably that the transfer apparatus 21 is provided with an auxiliary roller 65 that avoids interference between the mold 7 and the material recovery block 53 when the material recovery block 53 is located at the retreat position. The auxiliary roller 65 is provided above the mold presser roller 23, and both ends of the auxiliary roller 65 in the Y-direction are rotatably engaged with the mold presser roller supports 61.

The center axis C2 of the auxiliary roller 65 is parallel to the center axis C1 of the mold presser roller 23.

The mold 7 is also wrapped around the auxiliary roller 65. As a result, the mold 7 extending on the upper side of the mold presser roller 23 is located rearward in the X-direction as compared with the case where the auxiliary roller 65 is not provided.

Then, as illustrated in FIG. 6, it is possible to avoid interference between the mold 7 and the material recovery block 53 when the material recovery block 53 is positioned at the retreat position above the recovery position.

As illustrated in FIG. 4 and the like, the mold 7 wrapped around the auxiliary roller 65 includes a surface provided with the transfer pattern 9 and opposed to the auxiliary roller 65. Therefore, as illustrated in FIG. 5, if the transfer pattern 9 is provided only in a central portion 7A of the mold 7 in the width direction, a central portion 65A in the width direction of the auxiliary roller 65 may be formed with a smaller diameter so that the transfer pattern 9 does not abut on the auxiliary roller 65. In this case, it is possible to prevent the transfer pattern 9 from being damaged by the auxiliary roller 65, thereby allowing the mold 7 to be reused easily.

Figure 9:
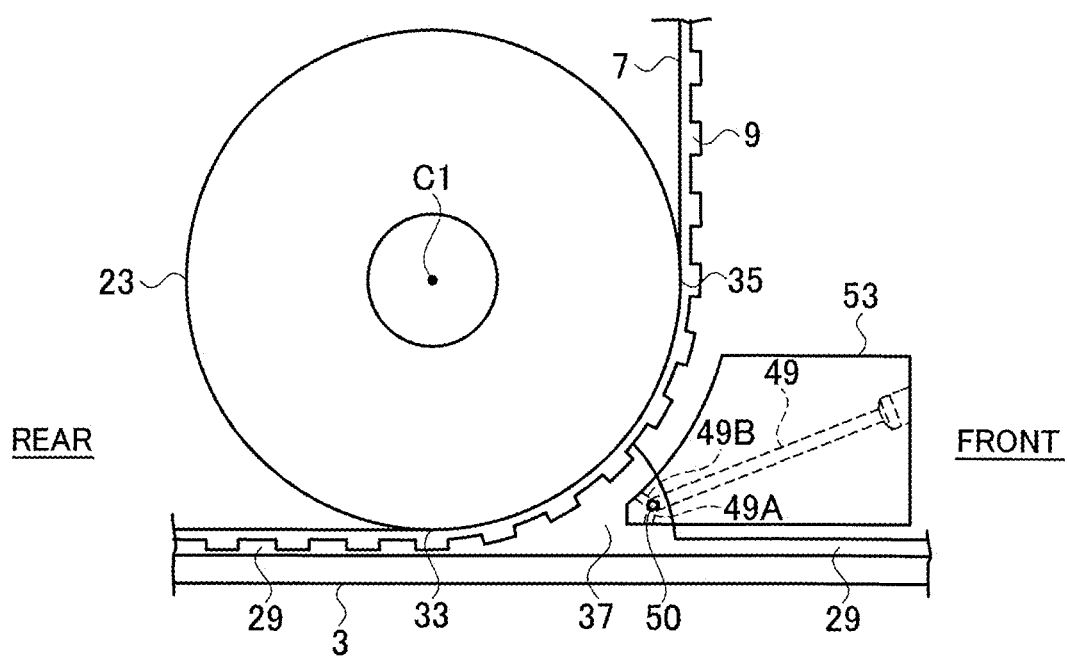
FIG. 9 is a view illustrating a modification of the positional relationship between a surplus material and the material recovery block.

In FIG. 2, the rear end of the material recovery block 53 in the X-direction, namely, the openings of the holes 49 as a suction port of the uncured resin 29 is illustrated so as to be slightly apart from the surplus material 37. However, as illustrated in FIG. 9, the material recovery block 53 may be arranged so that the rear end in the X-direction enters into surplus material 37.

In the embodiment illustrated in FIG. 3A, as viewed in the Y-direction, each of the holes 49 is provided, as the suction port of the uncured resin 29, with openings which are positioned at a rear end portion of a lower surface of the material recovery block 53 and a rear end portion of an inclined surface on the rear side of the material recovery block 53 (see reference numerals "49A" and "49B" of FIG. 3A). As a result, the material recovery block 53 sucks and recovers the uncured material 29 existing slightly forward of the surplus material 37 through the openings 49A. Additionally, the material recovery block 53 recovers even the uncured material 29 adhering to the mold 7.

Since the surplus material 37 is sucked and recovered through the openings 49A, the surplus material 37 is forced to flow forward.

Next, the operation of the transfer apparatus 21 will be described.

As illustrated in FIG. 1, the transfer apparatus 21 is provided with a controller 71 including a memory 67 and a CPU 69. The transfer apparatus 21 carries out the following operation by an operation program stored in the memory 67 beforehand.

In an initial state, the mold 7 is installed on the transfer apparatus 21, and the mold presser roller 23 and the material recovery block 53 are located behind the substrate installation part 25. On the substrate installation part 25, there is installed the material-preinstalled substrate 3.

In this initial state, it is performed to move the mold presser roller 23 around which the mold 7 is wound, toward a front side of the substrate 3 in the X-direction. Then, with the movement of the mold presser roller 23 to a position in front of the substrate installation part 25, the mold 7 is pressed against the entire upper surface of the substrate 3 provided with the uncured material 29. In other words, the mold 7 is pressed in a manner that the predetermined transfer pattern 9 enters into the uncured material 29 on the substrate 3.

While on the movement of the mold presser roller 23 or before the movement is ended, it is performed for the material recovery unit 27 to suck a portion or all of the surplus material 37 for its recovery.

Upon completion of pressing the mold 7 against the entire upper surface of the substrate 3, it is performed to irradiate ultraviolet light to the ultraviolet curable resin 29 for curing it. Thereafter, the mold presser roller 23 is moved to the rear side in the X-direction to peel the mold 7 from the substrate 3 and the material 29. Then, the surplus material 37 recovered by the material recovery unit 27 is reused.

As illustrated in FIGS. 4 and 6, in the initial state where the material recovery block 53 is rotatable, the material recovery block 53 is located at the retreat position, and thereafter, the material recovery block 53 is located at the recovery position when recovering the surplus material 37.

The transfer apparatus 21 includes the material recovery unit 27 that recovers the uncured surplus material 37 coming out from between the substrate 3 and the mold 7 when pressing the mold 7 against the substrate 3 with the movement of the mold presser roller 23. Therefore, even if the uncured material 29 is thickly provided on the substrate 3 to eliminate the occurrence of a portion of the substrate 3 where the transfer pattern 9 could not be transferred (a portion of the substrate 3 where the protrusion 5 has not been formed on the substrate 3 sufficiently) in the continuous transfer operation, the surplus material 37 is prevented from overflowing from the substrate 3.

According to the transfer apparatus 21, it is performed to reuse the uncured material recovered by the material recovery unit 27. Thus, it is possible to eliminate waste in the material (e.g. ultraviolet curable resin).

According to the transfer apparatus 21, the material recovery block 53 moves corresponding to the movement of the mold presser roller 23 for pressing the mold 7 against the substrate 3. Therefore, it is possible to recover the surplus material 37 during movement of the mold presser roller 23 for transfer, in accordance with the situation of the surplus material 37.

According to the transfer apparatus 21, the material recovery block 53 can be positioned at the recovery position and the retreat position. This makes it easier to confirm the state of the surplus material 37 during transfer. For instance, when transferring with a new material or a new mold for the first time, there is a case where it is desired to examine the setting of the thickness of the material or the timing of recovering the surplus material 37 by the material recovery part 27. In such a case, by locating the material recovery block 53 at the retreat position, it becomes easy to confirm the state (excessive or insufficient amount) of the surplus material 37 during transfer, for example, visually.

According to the transfer apparatus 21, owing to the provision of the auxiliary roller 65, the degree of freedom of setting the retreat position of the material recovery block 53 is increased. That is, even if the retreat position of the material recovery block 53 is set to a position that is obtained by rotating the block 53 from the recovery position greatly upward, it is possible to avoid the occurrence of interference between the mold 7 and the material recovery block 53. By setting the retreat position of the material recovery block 53 to such a position that is obtained by rotating the block 53 from the recovery position greatly upward, it becomes easier to see the surplus material 37.

The material recovery block 53 may be configured to move independently of the movement of the mold presser roller 23. That is, when the mold presser roller 23 moves in the X-direction to press the mold 7 against the substrate 3 installed on the substrate installation part 25, the material recovery block 53 may move separately from the mold presser roller 23, corresponding to the movement of the mold presser roller 23.

Figure 7:
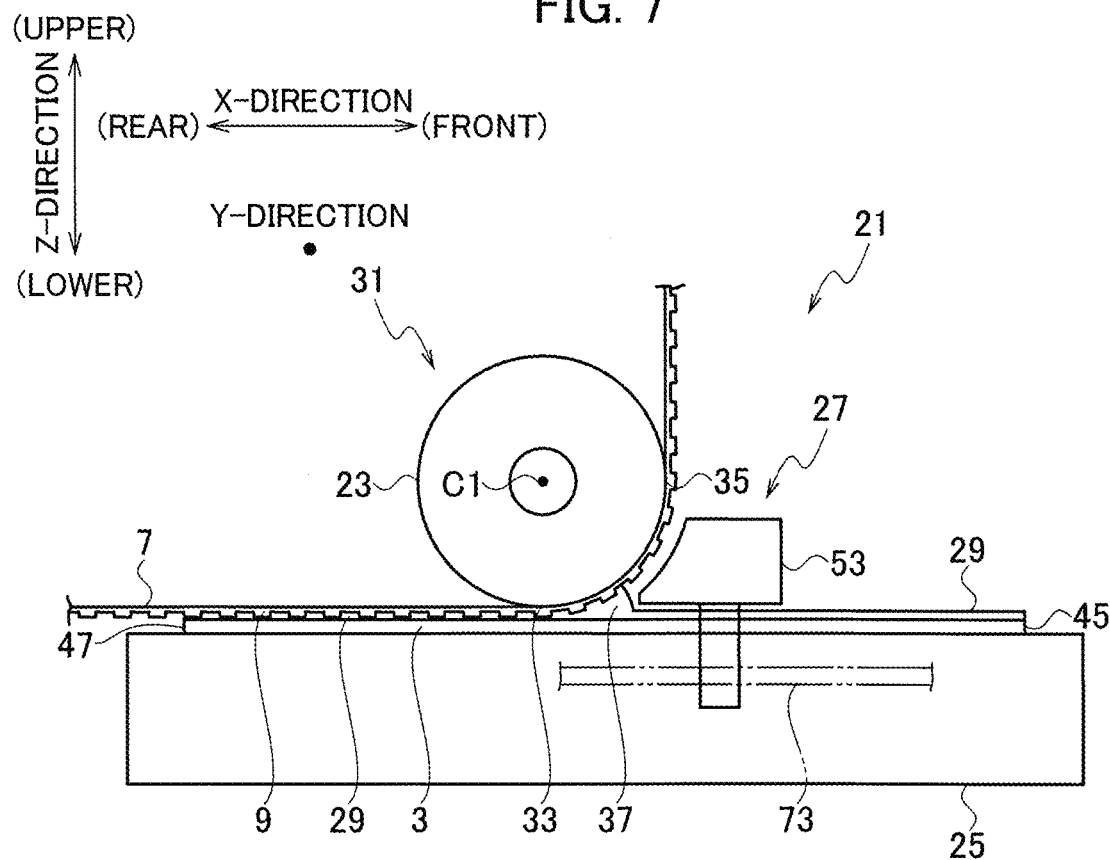
FIG. 7 is a view illustrating a schematic configuration of the transfer apparatus according to a first modification.

For example, according to a first modification illustrated in FIG. 7, the substrate installation part 25 includes a lead screw 73 such as a ball screw arranged so as not to interfere with the transfer operation of the substrate installation part 25. In operation, by rotating the lead screw 73 by an actuator such as a servo motor (not illustrated), the material recovery block 53 is configured to move in the X-direction, independently of the mold presser roller 23.

Figure 8:
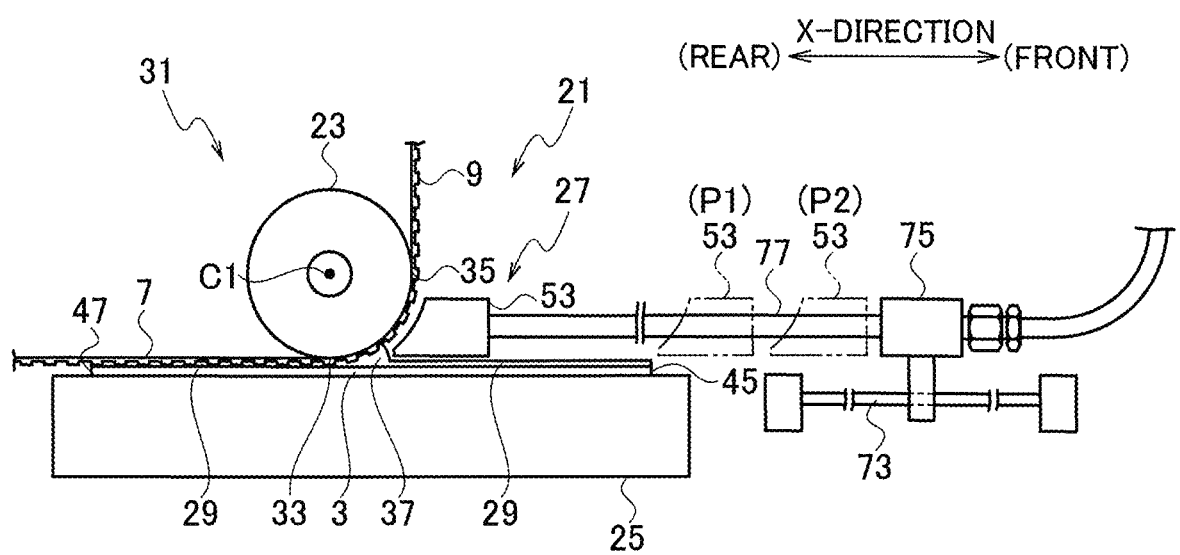
FIG. 8 is a view illustrating a schematic configuration of a transfer apparatus according to a second modification.

Alternatively, as illustrated in a second modification of FIG. 8, the material recovery block 53 may be moved by a lead screw 73 such as a ball screw arranged at a position away from the substrate installation part 25 on the front side in the X-direction, and a material recovery block support 75 engaged with the lead screw 73.

That is, by connecting the material recovery block support 75 with the material recovery block 53 through a tube-like connecting member 77 also serving as a flow path of the surplus material 37 sucked by the material recovery block 53 and by rotating the lead screw 73 by an actuator such as a servo motor (not illustrated), the material recovery block 53 and the material recovery block support 75 may be configured to move independently of the mold presser roller 23 in the X-direction.

Also in the modifications illustrated in FIGS. 7 and 8, the movement range of the material recovery block 53 in the X-direction is similar to that of the arrangements described with reference to FIGS. 1, 4, 6, and the like.

In the second modification where the material recovery block 53 is provided as illustrated in FIG. 8, the material recovery block 53 may be adapted so as to move only between the position P1 and the position P2 illustrated in FIG. 8.

In order to avoid interference of the mold presser roller 23 with the material recovery block 53 by the movement of the mold presser roller 23, when the mold presser roller 23 approaches near the front end of the substrate 3 installed on the substrate installation part 25, in other words, immediately before the operation of the mold presser roller 23 to press the mold 7 against the substrate 7 is completed, the material recovery block 53 may be moved to the front side in the X-direction while sucking the surplus material 37.

At the position indicated by "P1" in FIG. 8, the rear end of the material recovery block 53 is positioned in the vicinity of the front end of the substrate 3 installed on the substrate installation part 25. Further, at the position indicated by "P2" in FIG. 8, the transfer apparatus 21 is configured so that the mold presser roller 23 and the mold 7 do not interfere with the material recovery block 53 even when the mold presser roller 23 moves to the foremost position.

In the modifications of FIGS. 7 and 8, the material recovery block 53 is configured to move independently of the movement of the mold presser roller 23, corresponding to the movement of the mold presser roller 23. Therefore, it is possible to finely adjust the position of the material recovery block 53 with respect to the surplus material 37 and also possible to recover the surplus material 37 more accurately, depending on the mode of transfer, for example, the change in the form of the surplus material 37 derived from the change in the viscosity of the uncured material 29.

The material recovery block 53 may be produced by assembling a plurality of components. For example, as in a third modification illustrated in FIGS. 10A, 10B, and 11A to 11D, the material recovery block 53 may include a material recovery block body 79, an upper cover 81, and a lower cover 83, so that the surplus material 37 can be recovered through a slit 51.

The material recovery block body 79 is formed in a triangular prism shape, and the height direction of the triangular prism coincides with the Y-direction. In the material recovery block body 79, except for its both ends in the Y-direction, a first cutout part 85 is provided in a rear portion in the X-direction of the body 79. In the material recovery block body 79, except for its both ends in the Y-direction, a second cutout part 89 and a third cutout part 87 are provided at an upper end and a lower end of the body 79 in the Z-direction. These cutout parts 89, 87 are formed with slight depths, that is, depths approximately equal to the thicknesses of an upper cover 81 and a lower cover 83. The material recovery block body 79 is also provided with a hole 49 for sucking the surplus material 37.

The upper cover 81 and the lower cover 83 are formed in rectangular planar shapes. The upper cover 81 is fitted into the second cutout part 89 and fastened to the material recovery block body 79 by bolts or the like. The lower cover 83 is also fitted into the third cutout part 87 and fastened to the material recovery block body 79 by bolts or the like.

Consequently, the slit 51 is defined between the rear end of the upper cover 81 and the rear end of the lower cover 83, and the material recovery block 53 is in the form of a triangular prism having its external surfaces provided with almost no unevenness.

As illustrated in FIGS. 10A, 10B, and 11A to 11D, the material recovery block 53 may be provided with a plurality of through-holes 91 in the upper cover 81 and a plurality of through-holes 93 in the lower cover 83, through which the surplus material 37 is sucked into the block 53. These through-holes 91, 93 are arranged at predetermined intervals in the Y-direction, respectively.

The upper cover 81 and the lower cover 83 may be attached to the material recovery block body 79 without forming the second cutout part 89 and the third cutout part 87. In this case, the dimensions of the upper cover 81 and the lower cover 83 in the Y-direction are generally equal to the dimension of the material recovery block body 79 in the Y-direction.

The transfer apparatus 21 according to the embodiment includes: the substrate installation part 25 on which the substrate 3 is installed, the substrate 3 being provided with the uncured material 29 curable by irradiation with the electromagnetic wave having the predetermined wavelength; the mold presser roller 23 around which the mold 7 having the predetermined transfer pattern formed thereon is wound, the mold presser roller 23 configured to move to the substrate 3 installed on the substrate installation part 25 for pressing the mold 7 against the substrate 3; and the material recovery unit 27 capable of recovering the uncured material 37 protruding from between the substrate 3 and the mold 7 when pressing the mold 7 against the substrate 3 by moving the mold presser roller 23.

The above description may be grasped as an embodiment of the transfer method.

That is, the embodiment may be grasped as the transfer method, including: installing a substrate 3 on a substrate installation part 25, the substrate 3 having a surface provided with an uncured material 29 to be cured by irradiation with electromagnetic wave of a predetermined wavelength; pressing a mold 7 against the substrate 3 provided with the uncured material 29 and also installed on the substrate installation part 25 by moving a mold presser roller 23 to the substrate 3, the mold presser roller 23 around which the mold 7 having a predetermined transfer pattern formed on one surface thereof in the thickness direction is wound; recovering the uncured material 37 protruding from between the substrate 3 and the mold 7 at least either when moving the mold presser roller 23 at the pressing of the mold 7 or when the pressing of the mold 7 is completed; curing the uncured material 29 by irradiating the electromagnetic wave to the uncured material 29 on a portion of the substrate 3 where the pressing of the mold 7 against the substrate 3 has been completed; and peeling the mold 7 from the substrate 3 and the material after the curing of the uncured material 29.

In this case, the curing of the uncured material 29 may be sequentially curing the uncured material 29 by irradiating the electromagnetic wave to the uncured material 29 on a portion of the substrate 3 where pressing the mold 7 against the substrate 3 has been completed, before all the pressing of the mold 7 is completed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transfer apparatus, comprising:
a substrate installation part on which a substrate is installed, the substrate being provided with an uncured material curable by irradiation with electromagnetic wave having a predetermined wavelength;
a mold presser roller around which a mold having a predetermined transfer pattern formed thereon is wound, the mold presser roller configured to move to the substrate installed on the substrate installation part for pressing the mold against the substrate; and
a material recovery unit comprising a material recovery block formed with a hole or a slit for sucking the uncured material, the material recovery unit comprising a concave inclined surface extending in a direction of a center axis of the mold presser roller and positioned at a front side of the center axis of the mold presser roller in a moving direction of the mold presser roller, the material recovery unit being configured to suck at least a portion of the uncured material adhering to the mold and protruding from between the substrate and the mold at the front side of the center axis of the mold presser roller in a moving direction of the mold presser roller by the material recovery block to recover the uncured material when pressing the mold against the substrate by moving the mold presser roller, wherein
the material recovery block is configured so that the material recovery block moves corresponding to the movement of the mold presser roller when the mold presser roller moves to press the mold against the substrate installed on the substrate installation part.

2. The transfer apparatus of claim 1, wherein
the material recovery block is provided so as to be rotatable to the mold presser roller and rotationally positioned at a recovery position for recovering the uncured material and a retreat position apart from the recovery position.

3. The transfer apparatus of claim 2, further comprising
an auxiliary roller around which the mold is wound, the auxiliary roller configured to avoid interference between the mold and the material recovery block when the material recovery block is located at the retreat position.

4. The transfer apparatus of claim 1, wherein
the material recovery block is configured so that the material recovery block moves independently of the movement of the mold presser roller corresponding to the movement of the mold presser roller when the mold presser roller moves to press the mold against the substrate.

5. The transfer apparatus of claim 1, further comprising
an irradiation unit configured to emit the electromagnetic wave, wherein
the irradiation unit is configured to move simultaneously with the movement of the mold presser roller and irradiate the electromagnetic wave on a portion of the substrate where the pressing of the mold against the substrate has been completed for curing the uncured material.

6. The transfer apparatus of claim 1, wherein at least a portion of the uncured material sucked by the material recovery unit is combined with the uncured material and provided with the substrate.

* * * * *